United States Patent [19]

Schinzel

[11] Patent Number: 5,270,672
[45] Date of Patent: Dec. 14, 1993

[54] CONNECTING ARRANGEMENT FOR PROVIDING A RELEASABLE CONNECTION BETWEEN TWO STRIPLINES

[75] Inventor: Peter Schinzel, Boeblingen, Fed. Rep. of Germany

[73] Assignee: Hewlett-Packard Company, Palo Alto, Calif.

[21] Appl. No.: 972,507

[22] Filed: Nov. 6, 1992

[30] Foreign Application Priority Data

Nov. 16, 1991 [EP] European Pat. Off. ........ 91119586.5

[51] Int. Cl.$^5$ ............................................. H01P 5/00
[52] U.S. Cl. ................................... 333/246; 333/260
[58] Field of Search ................... 333/33, 238, 246, 260

[56] References Cited

U.S. PATENT DOCUMENTS

| 4,047,132 | 9/1977 | Krajewski | 333/238 |
| 4,208,642 | 6/1980 | Saunders | 333/260 X |
| 5,065,124 | 11/1991 | Chrzan | 333/246 |

FOREIGN PATENT DOCUMENTS

| 0137694 | 4/1985 | European Pat. Off. |
| 0325068 | 7/1989 | European Pat. Off. |
| 111401 | 6/1984 | Japan ........................ 333/33 |
| 238303 | 9/1989 | Japan ........................ 333/246 |

OTHER PUBLICATIONS

Berg, William, "Multi-GHz Elastomeric Connectors For Complex Hybrids and Chip Carriers," 1989 Proceedings, 39th Electronic Components Conference, May 22-24, 1989, pp. 50-70 (©IEEE).

Primary Examiner—Paul Gensler

[57] ABSTRACT

A first stripline on a first dielectric carrier material having a first dielectric constant is releasably connected to a second stripline on a second dielectric carrier material having a second dielectric constant by means of an elastic connection strip including a plurality of surface contact strips which extend transversely to its longitudinal direction. In order to reduce reflections at the location of connection, the striplines have the same width and the first carrier material is provided with an additional conductive inner layer, which is connected to ground potential, and, depending on the two dielectric constants and on the thickness of the second carrier material, the distance between the first stripline and the additional conductive inner layer is chosen such that the two striplines have characteristic impedances which correspond to one another.

6 Claims, 2 Drawing Sheets

CONNECTING ARRANGEMENT FOR PROVIDING A RELEASABLE CONNECTION BETWEEN TWO STRIPLINES

BACKGROUND OF THE INVENTION

Field of Invention

The present invention refers to a connecting arrangement for providing a releasable electric connection between a first stripline on a first dielectric carrier material and a second stripline on a second dielectric carrier material by means of an elastic connection strip.

State of the Art

A connecting arrangement of the type mentioned at the beginning, which, in view of the nature of the connection strip used for providing the releasable electric connection between the two striplines, is also referred to as elastomeric-strip connecting arrangement, is known from EP-A-325068.

In the case of this prior art connecting arrangement, the first carrier material has a first dielectric constant which differs from that of the second carrier material. The first carrier material has a first thickness and the second carrier material has a second thickness. A conductive plane, which is connected to a reference potential, is arranged on the sides of the carrier materials facing away from the striplines. The elastic connection strip is arranged on a boundary line, at which the carrier materials border on each other, such that it extends along said boundary line and includes a plurality of surface contact strips which extend transversely to its longitudinal direction.

A typical case of use of such a connecting arrangement is the provision of a releasable electric connection between a PC board and a hybrid, said case of use being explained hereinbelow with reference to FIG. 3 and 4.

As can be seen in these two figures, the connecting arrangement, which is shown in said figures and which is provided with reference numeral 1 in its entirety, comprises a PC board 2 on the one hand and a hybrid 3 on the other. The PC board 2 is provided with a first dielectric carrier material 4 having a first dielectric constant $\epsilon 1$, which can e.g. be 4.5, said FIG. 3 and 4 showing only a small section of the PC board 2 as well as of the hybrid 3. The hybrid 3 is provided with a second dielectric carrier material 5 whose second dielectric constant $\epsilon 2$ is e.g. 9.8.

As can be seen in FIG. 3, the thickness h1 of the first dielectric carrier material 4 exceeds the thickness h2 of the second dielectric carrier material 5.

A first stripline 6 having a first stripline width w1 extends on the PC board. A second stripline 7 having a second stripline width w2 extends on the hybrid 3.

A ground plane of the PC board 2 and a ground plane of the hybrid 3 for the two striplines 6, 7 are defined by first and second conductive layers 8 and 9, respectively, said layers 8 and 9 being rear layers, i.e. they are formed on the sides of the carrier materials 4, 5 which face away from the striplines 6, 7, and resting on a metal support structure 10. At a boundary line 11, at which the two carrier materials 4, 5 border on each other, the metal support structure 10 is provided with a step 12, which levels the difference between the thicknesses h1, h2 of the two carrier materials 4, 5 so that the two striplines 6, 7 are positioned on the same level.

In the case of this known connecting arrangement 1, a releasable electric connection between the two striplines 6, 7 is provided by placing an elastic connection strip (which is not shown for clarity of representation) onto the boundary line 11 such that it extends in the longitudinal direction thereof. The elastic connection strip includes a plurality of surface contact strips 13, which extend transversely to its longitudinal direction, as is schematically shown in FIG. 3 and 4. These surface contact strips 13 extend typically in the cross-sectional plane of the elastic connection strip as stripshaped surface metallizations on the body of the elastic connection strip, said body consisting typically of silicone.

A possible structural design of such a connection strip is shown in the above-mentioned EP-A-325068.

Due to the different dielectric constants and due to the different thicknesses of the carrier materials 4, 5, the striplines 6, 7 have different widths w1, w2 in combination with corresponding characteristic impedances.

As is shown in rough outlines in FIG. 4, this has the effect that only part of the surface contact strips 13, which are in contact with the first stripline 6, rest on the second stripline 7 as well. The other surface contact strips 13, which are in contact with the first stripline 6, form on the side of the hybrid 3 a capacitive interference element together with the rear conductive layer 9 of said hybrid, said interference element causing undesirable partial reflections of pulses, which are transmitted through the connecting arrangement.

In cases of use in which the above-described mismatch of the characteristic impedances of the striplines, which is caused by the elastic connection strip, is regarded as being not acceptable, a non-releasable connection technology for connecting the striplines has therefore been used up to now, such a non-releasable connection technology being e.g. bonding.

SUMMARY OF THE INVENTION

It follows that, taking as a basis this prior art, the present invention is based on the object of further developing a connecting arrangement, which is used for electrically connecting two striplines on carrier materials with different dielectric constants, in such a way that a low-reflection connection between the striplines is achieved in spite of the releasability of the connection.

The present invention encompasses connecting arrangements for providing a releasable electric connection between a first stripline on a first dielectric carrier material and a second stripline on a second dielectric carrier material, wherein the first carrier material has a first dielectric constant ($\epsilon 1$) which differs from that ($\epsilon 2$) of the second carrier material, the first carrier material has a first thickness (h1), the second carrier material has a second thickness (h2), and conductive planes connected to a reference potential are arranged on the sides of the carrier materials facing away from the striplines. Such connecting arrangements in accordance with the present invention comprise an elastic connection strip arranged on a boundary line at which the carrier materials border on each other such that it extends along the boundary line and includes a plurality of surface contact strips which extend transversely to its longitudinal direction; and means for providing the first carrier material a conductive inner layer connected to the reference potential, wherein the striplines have the same width (w1, w2) and the distance (h1*) between the first stripline and the conductive inner layer is chosen, in accordance with the two dielectric constants ($\epsilon 1$, $\epsilon 2$) and the thickness (h2) of the second carrier material, such that characteristic impedances of the two striplines correspond to one another.

In one embodiment of the invention, the first carrier material comprises a multi-layer board and the multi-layer board is provided with at least one plated-through hole connecting the conductive inner layer to one of the conductive planes.

A preferred embodiment of a connecting arrangement according to the present invention is described in detail below. Briefly, a first stripline (6) on a first dielectric carrier material having a first dielectric constant is releasably connected to a second stripline (7) on a second dielectric carrier material (5) having a second dielectric constant by means of an elastic connection strip including a plurality of surface contact strips (13) which extend transversely to its longitudinal direction. In order to reduce reflections at the location of connection, the striplines (6, 7) have the same width (w1, w2) and the first carrier material (4) is provided with an additional conductive inner layer (14), which is connected to ground potential, and, depending on the two dielectric constants and on the thickness of the second carrier material (5), the distance between the first stripline (6) and the additional conductive inner layer (14) is chosen such that the two striplines (6, 7) have characteristic impedances which correspond to one another.

BRIEF DESCRIPTION OF THE DRAWINGS

In the following, a preferred embodiment of the connecting arrangement according to the present invention will be explained in detail with reference to the drawings enclosed, in which.

DETAILED DESCRIPTION OF A PREFERRED EMBODIMENT

Figure 3:
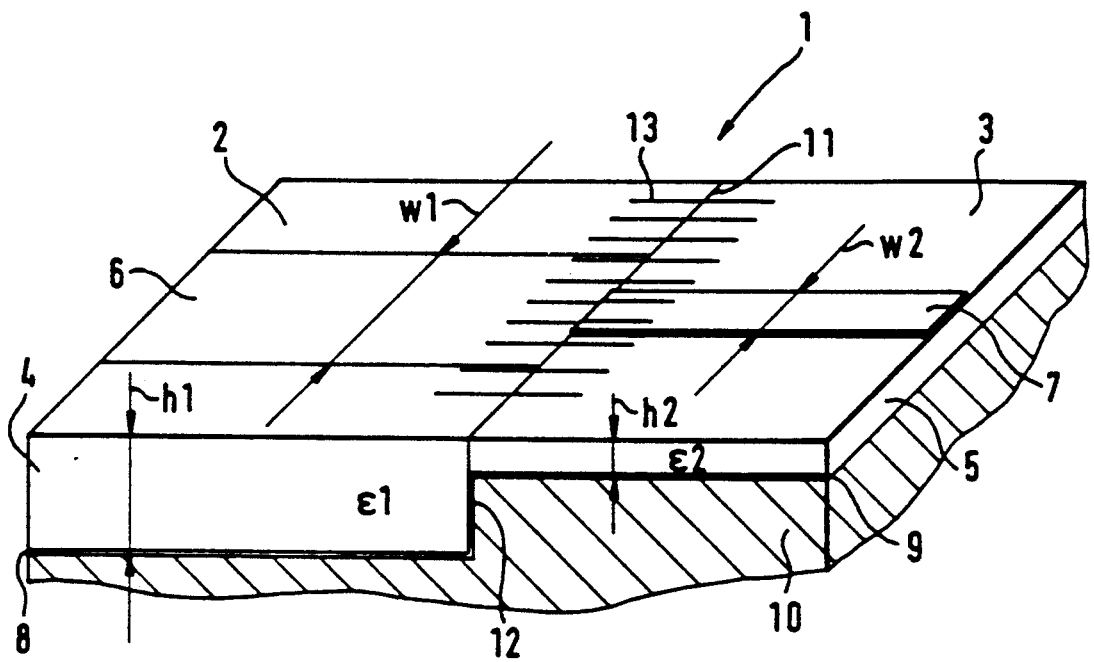
FIG. 3 shows a perspective representation of a connecting arrangement according to the prior art.
Figure 4:
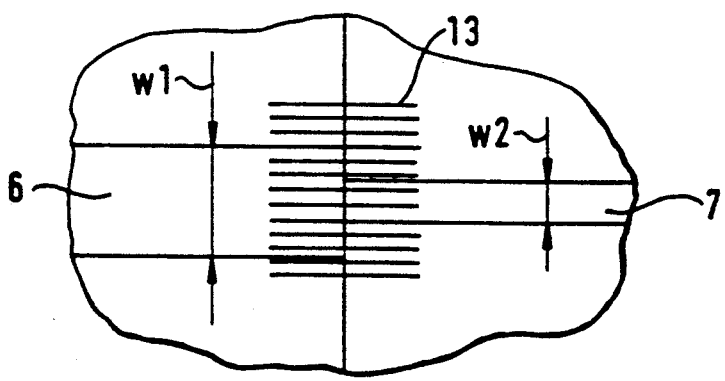
FIG. 4 shows a top view of the connecting arrangement shown in FIG. 3.

The elements of the connecting arrangement according to the present invention corresponding to the connecting arrangement according to the prior art as disclosed in FIG. 3 and 4, which has already been described, are provided with corresponding reference numerals so that a renewed explanation of these elements can be dispensed with.

Figure 1:
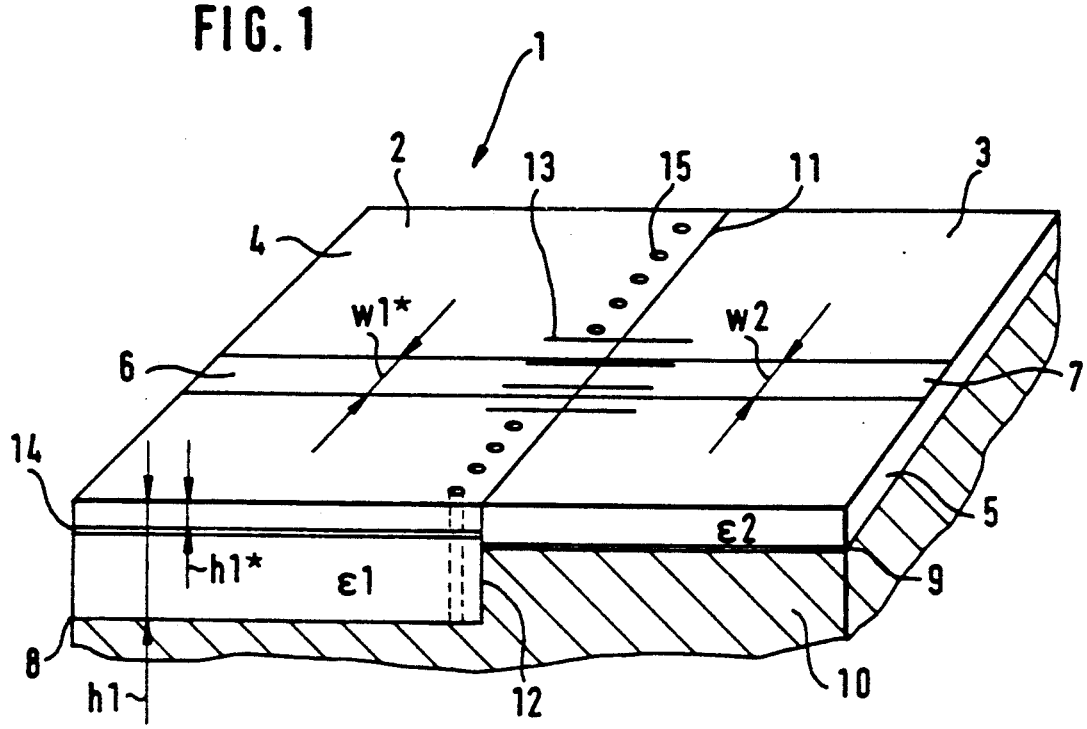
FIG. 1 shows a perspective representation of an embodiment of the connecting arrangement according to the present invention.
Figure 2:
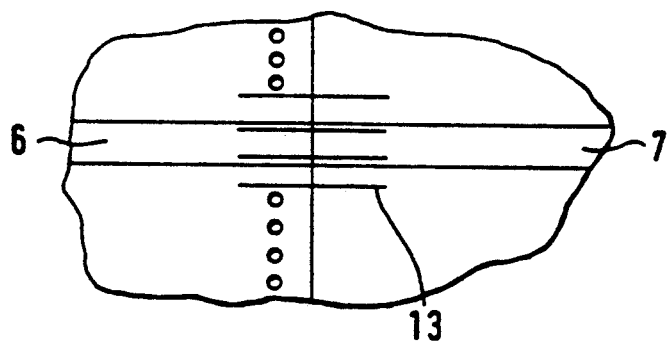
FIG. 2 shows a top view of the embodiment of the connecting arrangement according to the present invention.

In the case of the connecting arrangement according to the present invention as shown in FIGS. 1 and 2, the width w1* of the first stripline 6 is chosen such that it corresponds to the width w2 of the second stripline 7. The first carrier material 4 is provided with an additional conductive inner layer 14, which is connected to the reference potential. Depending on the two dielectric constants $\epsilon 1$, $\epsilon 2$ of the two carrier materials 4, 5 and on the thickness h2 of the second carrier material, the distance h1* between the first stripline 6 and the additional conductive inner layer 14 is chosen such that the characteristic impedances of the two striplines correspond to one another. In the case of a preferred mode of application, in which the first stripline 6 is formed on a PC multi-layer board and the second stripline 7 extends on a hybrid, the additional conductive inner layer 14 can be created without any extra technical expenditure by connecting a continuous conductive inner layer, which is part of the PC multi-layer board and which extends at the adequate distance h1* to the surface, with the aid of a suitable connection structure to the rear ground plane 8 of the PC multi-layer board. It should be noted that the thickness h1 of the PC board cannot be reduced to such an extent that it corresponds to h1* as this would result in an unacceptably weakened mechanical strength of the PC board.

In the case of the embodiment shown, a plurality of metallized through holes 15 serves as a connection structure.

The determination of the distance h1* for adapting the characteristic impedance of the first stripline 6 to that of the second stripline 7, on the basis of the width of the first stripline which is given by the width of the second stripline, on the basis of the given thickness h2 of the second carrier material and on the basis of the given dielectric constants $\epsilon 1$, $\epsilon 2$, will be carried out either by means of a numerical simulation program or experimentally. When determining the distance h1* numerically, an approximation formula can be used for the characteristic impedances of the two striplines, said approximation formula being stated in: Reinmut K. Hoffmann, Integrierte Mikrowellenschaltungen, Springer-Verlag, Berlin 1983, on page 152.

As can be seen in FIG. 2, capacitive interference elements cannot occur in the case of the connecting arrangement 1 according to the present invention, since, due to the suitably arranged additional inner ground plane 14, it is possible to adapt the conductor widths of the two striplines 6, 7 to one another. Hence, the present invention permits the application of releasable connection technology by means of elastic connection strips also in cases of use where a well-adapted, low-reflection transition between the striplines is of importance.

It follows that the possibilities of using the connecting arrangement according to the present invention are by no means limited to cases where a stripline of a PC multi-layer board has to be connected to a stripline of a hybrid. The connecting arrangement is also suitable for connecting striplines in the field of digital application, and in particular data transmission lines in the case of computers.

The connecting arrangement can just as well be used for providing a releasable, low-reflection connection between microstriplines for pulse and signal transmission in the GHz region.

What is claimed is:

1. A connecting arrangement for providing a releasable electric connection between a first stripline on a first dielectric carrier material and a second stripline on a second dielectric carrier material by means of an elastic connection strip, in the case of which the first carrier material has a first dielectric constant which differs from that of the second carrier material, the first carrier material has a first thickness (h1), the second carrier material has a second thickness (h2), conductive planes, which are connected to a reference potential, are arranged on the sides of the carrier materials facing away from the striplines, and the elastic connection strip is arranged on a boundary line, at which the carrier materials border on each other, such that it extends along said boundary line and includes a plurality of surface contact strips which extend transversely to its longitudinal direction, wherein the striplines have the same width (w1, w2), the first carrier material is provided with a conductive inner layer, which is connected to the reference potential, and depending on the two dielectric constants ($\epsilon_1$, $\epsilon_2$) of the carrier materials and on the thickness (h2) of the second carrier material, the distance (h1*) between the first stripline and the conductive inner layer is chosen such that the characteristic impedances of the two striplines correspond to one another.

2. A connecting arrangement according to claim 1, wherein the first carrier material is defined by the dielectric of a multi-layer board.

3. A connecting arrangement according to claim 2, wherein the multi-layer board is provided with at least one plated-through hole, which connects the conductive inner layer to the conductive plane arranged on the side facing away from the stripline.

4. A connecting arrangement for providing a releasable electric connection between a first stripline on a first dielectric carrier material and a second stripline on a second dielectric carrier material, wherein the first carrier material has a first dielectric constant ($\epsilon_1$) which differs from that ($\epsilon_2$) of the second carrier material, the first carrier material has a first thickness (h1), the second carrier material has a second thickness (h2), and conductive planes connected to a reference potential are arranged on the sides of the carrier materials facing away from the striplines, comprising:

(a) an elastic connection strip arranged on a boundary line at which the carrier materials border on each other such that it extends along said boundary line and includes a plurality of surface contact strips which extend transversely to its longitudinal direction; and (b) means for providing the first carrier material a conductive inner layer connected to the reference potential, wherein the striplines have the same width (w1, w2) and the distance (h1*) between the first stripline and the conductive inner layer is chosen, in accordance with the two dielectric constants ($\epsilon_1$, $\epsilon_2$) and the thickness (h2) of the second carrier material, such that characteristic impedances of the two striplines correspond to one another.

5. A connecting arrangement according to claim 4, wherein the first carrier material comprises a multi-layer board.

6. A connecting arrangement according to claim 5, wherein the multi-layer board is provided with at least one plated-through hole connecting the conductive inner layer to one of said conductive planes.

* * * * *